United States Patent [19]
Jasper et al.

[11] Patent Number: 5,343,499
[45] Date of Patent: Aug. 30, 1994

[54] QUADRATURE AMPLITUDE MODULATION SYNCHRONIZATION METHOD

[75] Inventors: Steven C. Jasper, Hoffman Estates; James A. Butler, Elgin, both of Ill.

[73] Assignee: Motorola, Inc., Schaumburg, Ill.

[21] Appl. No.: 818,327

[22] Filed: Jan. 9, 1992

Related U.S. Application Data

[63] Continuation-in-part of Ser. No. 537,199, Jun. 12, 1990, abandoned.

[51] Int. Cl.5 .............................................. H04L 5/12
[52] U.S. Cl. .................................... 375/39; 375/97; 375/106; 455/59; 455/71
[58] Field of Search ................ 375/38, 39, 40, 97, 375/109, 106; 370/69.1; 455/59, 60, 71

[56] References Cited

U.S. PATENT DOCUMENTS

| | | | |
|---|---|---|---|
| 4,768,187 | 8/1988 | Marshall | 370/69.1 |
| 4,881,241 | 11/1989 | Pommier et al. | 375/38 |
| 5,134,633 | 7/1992 | Werner | 375/38 |
| 5,170,413 | 12/1992 | Hess et al. | 375/38 |
| 5,272,724 | 12/1993 | Solomon et al. | 375/38 |

*Primary Examiner*—Stephen Chin
*Assistant Examiner*—T. Ghebretinsae
*Attorney, Agent, or Firm*—Joseph P. Krause

[57] ABSTRACT

In a QAM communications system, a novel synchronizing sequence of symbols added to the information channel simplifies acquisition of timing and synchronization by a receiver. Such synchronization vectors provide signals for improved AFC control signal generation.

9 Claims, 5 Drawing Sheets

WHERE $(\angle X_{i,j} - \angle X_{i,j-1})$ = ACTUAL ANGLE BETWEEN SYNC SYMBOLS
$(\angle S_{i,j} - \angle S_{i,j-1})$ = EXPECTED ANGLE BETWEEN SYNC SYMBOLS
$W_{ij}$ = WEIGHTING FACTOR

*FIG.12*

QUADRATURE AMPLITUDE MODULATION SYNCHRONIZATION METHOD

This application is a continuation-in-part of U.S. application Ser. No. 07/537,199, filed Jun. 12, 1990, now abandoned.

FIELD OF THE INVENTION

This invention relates to communications methods. In particular, this invention relates to so called quadrature amplitude modulation, or QAM, which is a modulation technique used to convey information, including digital information, using less bandwidth than other types of modulation such as FM or AM.

BACKGROUND OF THE INVENTION

QAM is well known in communications art and combines characteristics of both phase modulation and amplitude modulation to reduce the bandwidth required to carry a certain amount of information in an information-bearing signal. In QAM, information is conveyed using changes in both the amplitude of a carrier wave and the relative phase angle of the carrier signal with respect to a reference angle. Using QAM modulation to convey digital data, 2, 3, 4, or more, bits of digital information can be conveyed per QAM signal element.

Multi-carrier QAM is a technique in which an information-bearing signal, such as serial digitized voice, digital data from a computer or other machine for example, is divided up into multiple, separate, frequency division multiplexed QAM signals. Each QAM signal occupies a discrete frequency band (with each of the bands being substantially frequency adjacent to the others) and carries a portion of the information in the information-bearing signal.

A problem with QAM-based communications systems, including multi-carrier QAM, is consistently and coherently demodulating information in a QAM signal. A QAM signal conveys information using both the amplitude of a carrier wave and the phase angle. The magnitude and phase angles of a carrier, are represented as vectors (which have a magnitude and phase angle with respect to some reference axis) that point to various points or loci on a Cartesian plane, each locus on the plane identifies a particular binary value. Each vector can be represented as a carrier having a particular amplitude level with a carrier signal at some distinct phase angle.

For example, a vector having a unit length of one at a forty five degree angle with respect to the x-axis might "point" to a point identified as representing a binary value or pattern of 0010. A vector with a unit length of one-half and at forty five degrees might point to a point identified as representing a binary value of 0110. A vector with length equal to one, at zero degrees might represent 0000, and so on. The relative magnitude and phase angle of a carrier signal correspond to the relative magnitude and phase of a vector that points to a particular point in a plane, which represents binary values assigned to the point. (A transmitted signal, that represents a vector that points to a particular point on a plane, which point is established to represent some binary value, is detected, demodulated and decoded by the receiver to yield the binary value represented by the vector.) Vectors of varying magnitude and phase angles can represent multiple binary values. (The number of discernible amplitudes and phase angles will increase the number of bits of information representable by each QAM signal element. Increasing the number of possible amplitude levels and decreasing phase angle differences will increase the transmitter power required.) Sending streams of vectors, represented as bursts of amplitude and phase-modulated RF carrier, is a way of sending streams of digital information. (Multilevel QAM is well known art. See for example "All About Modems" copyright 1981 by Universal Data Systems, Inc. or other digital communications texts.)

To coherently detect information from QAM elements in a QAM signal, a receiver must be able to accurately differentiate between amplitude variations in the carrier wave as well as phase angle changes. In many environments, phase jitter or phase shift may accompany fading and multi-path signal propagation. A receiver must be able to reliably detect phase angle changes and carrier amplitude despite fading and multi-path propagation. When multi-carrier QAM is used, each QAM signal may experience its own fading requiring that each QAM signal have its own synchronizing sequence.

A synchronizing sequence of QAM signal elements that permit a receiver to synchronize to, or lock up with, the QAM transmitter may assist the receiver in locating the relative timing of an information stream. Arbitrary synchronizing sequences for a QAM receiver may provide no real benefit however, if the synchronizing sequence requires relatively complex computational activities to be carried on by the receiver. A QAM communications system that simplifies the complexity of a QAM receiver would be an improvement over the prior art.

In a multi-carrier QAM information system it may be necessary to provide synchronization information in each of the subchannels to permit a receiver to coherently detect information in each subchannel. A synchronizing sequence that is adapted for use with multichannel QAM would be an improvement over the prior art. A QAM receiver that must detect the synchronizing sequences might be simplified if the synchronizing sequences are chosen to reduce computational complexity required to identify signalling sequences in multiple QAM channels. Other benefits from a preferred synchronizing sequence are also realized as well, including simplified automatic frequency control for the receiver IF stages and improved synchronization timing.

SUMMARY OF THE INVENTION

There is provided herein a method of permitting simplified acquisition of timing and frequency synchronization by a QAM receiver. The method includes providing a signal vector synchronizing sequence that is a stream of QAM signal elements, to a QAM information signal, and in particular to substantially each QAM channel of a multi-carrier QAM system. The synchronizing sequences are selected to minimize computation time required by a QAM receiver.

In a multi-carrier QAM system, QAM subchannels centered about a center frequency (When a base-band QAM signal is up-shifted in frequency, the QAM subchannels comprising a multi-carrier QAM system can be shifted by slightly different amounts whereby the channels can be frequency centered about some frequency.) are paired. One QAM subchannel of a pair of subchannels, the first subchannel, has a center frequency, $f_1$, offset from the center frequency $f_0$ of the multi-carrier signal by some amount—$\Delta f1$. The other QAM subchannel of a pair of subchannels, the second subchannel, has its own center frequency, $f_2$, offset from the center frequency $f_0$ of the multi-carrier signal $f_0$ by an amount equal to $+\Delta f1$.

The synchronizing sequence is comprised of complex vectors and their complex conjugates. The QAM signal vector synchronizing sequence in the first subchannel and the signal vector synchronizing sequence in the second subchannel are complex conjugates of each other. (Multi-carrier QAM systems that have four, six, eight, or more, QAM subchannels, have signal vector synchronizing symbols in substantially each pair of subchannels that are complex conjugates.) The vector synchronizing sequences are chosen so that when they are added, or summed, prior to transmission, the addition of the paired signal vector synchronizing sequences produces a resultant signal that has only a real component, i.e. a signal with no imaginary component, on the real axis. Detection of the synchronizing sequence can be simplified by designing a receiver filter that looks only for the waveform produced by vector pairs having no angular component.

In a multi-channel informational system that carries QAM symbols in each channel, the synchronizing sequence added to each channel that is comprised of pairs of complex numbers and complex conjugates a QAM receiver must look for only a particular wave form to detect the timing of a QAM information stream.

Secondary benefits of the pairing of QAM subchannels about a center frequency for the multi-carrier QAM system and the use of complex vectors and their complex conjugates in the paired QAM subchannels includes improved automatic frequency control for the receiver and improved synchronization of the receiver to the transmitted QAM symbols.

DESCRIPTION OF A PREFERRED EMBODIMENT

Figure 1:
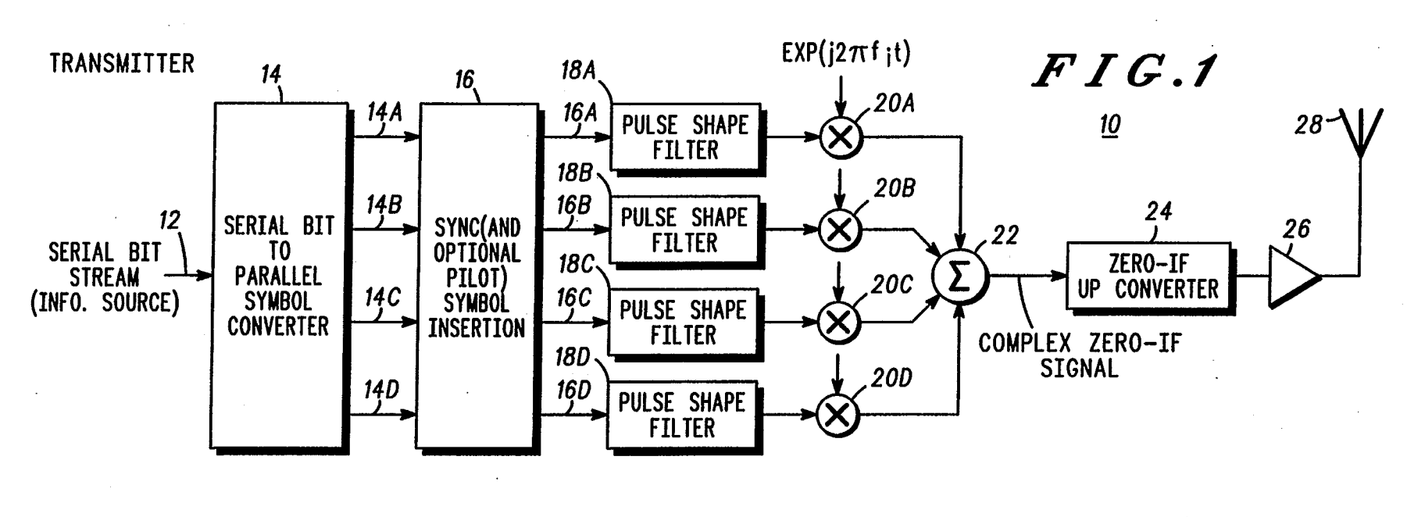
FIG. 1 shows a block diagram of a four-subchannel QAM transmitter.

FIG. 1 shows a simplified block diagram of a four subchannel QAM transmitter (10). The QAM transmitter (10) formats information from a serial data source (12) into four subchannels, wherein each subchannel carries a fractional amount of the information in the original serial bit stream (12). The serial bit stream (12) may originate from virtually any particular source. The serial bit stream might be digitized voice information, data from a computer or the like, or any other similar source of such information.

The serial data of the serial bit stream (12) is formatted by a serial to parallel converter and QAM symbol formatter (14), which formats the serial bit stream (12) into 4 different QAM signal streams (14A, 14B, 14C, and 14D), wherein each QAM signal stream is comprised of a stream of QAM symbols. Each of the QAM symbols on outputs A, B, C, and D of block 14 are complex valued QAM symbols, each QAM symbol having a relative magnitude and phase angle to represent a plurality of bits and being represented as a phasor or vector having a magnitude and a relative phase angle. (QAM or quadrature amplitude modulation is well known in the art and is a modulation technique by which several data bits of information can be represented by a single quantity.)

Figure 7:
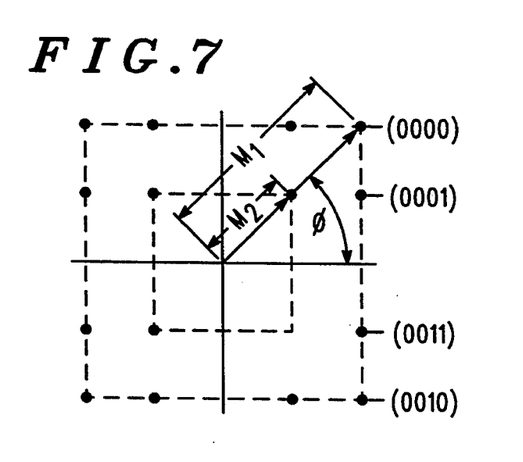
FIG. 7 shows a signal constellation for a 16 level QAM communications system.

Turning to FIG. 7, there is depicted a constellation map of 16 locations on a coordinate system each one of which is assigned a unique binary bit pattern of the 16 possible bit patterns representable by a four-bit binary word. Since the outputs of the QAM symbol formatter (14) represent four-bit binary words, there are sixteen possible different output vectors or symbols that correspond to the 16 possible binary values. Every possible bit pattern is assigned a location on the coordinate system shown in FIG. 7. A complex vector, having a magnitude corresponding to its length, and a phase angle corresponding to its angular displacement from a reference axis, represents the bits that it "points" to at a particular constellation point. Successive vectors that each have magnitudes and phase angles can thereby be used to represent successive bit patterns output from one of the outputs A, B, C, or D by pointing to appropriate constellation points.

For example, a 4 bit pattern of all zeroes, produced in the process of converting 16 consecutive serial bits from bit stream (12) to 4, 4-bit words could be represented by a vector with magnitude M1 at 45 degrees. In a radio system, this vector M1 would typically be transmitted as a carrier wave of a certain magnitude corresponding to the magnitude of M1 and with a certain relative phase shift of $\phi_1$, which magnitude and phase shift can be identified by a receiver as for example a 45 degree phase shift from some reference value.

A second 4 bit pattern produced by combining 4 other bits from the serial bit stream 12 might be represented by another vector M2 having a smaller magnitude but at the same relative phase angle as the vector M1. In transmitting just two successive complex valued vectors such as M1 and M2 instead of 8 bits, many digital information symbols or bits can be transmitted in a shorter time period.

The outputs A-D from the QAM symbol formatter block (14) are considered to be secondary information signals which secondary information signals are, by virtue of the conversion in block 14, multi-valued complex QAM signal streams, each stream being comprised of a plurality of individual QAM symbols.

Each of the 4 secondary information signals (14A-14D) output from the serial to parallel converter block (14) contains a fractional amount of the information in the serial bit stream (12) and is used to modulate a carrier signal forming thereby 4 QAM subchannels, each subchannel being centered about its own center frequency.

Synchronization symbols are inserted into each of the QAM signals (14A-14D) by a sync insertion block (16) as shown. (The actual synchronization symbols can be generated by a microcomputer, a suitable digital signal processor or other comparable device.) Since the output from the serial to parallel converter block (14) are four streams of complex valued QAM symbols, the synchronization symbols inserted by the sync and symbol insertion block (16) into the four streams (14A-14D) are also discrete complex QAM samples of information. The QAM symbols output (16A-16D) from the synchronization symbol insertion block (16), which include the QAM symbols from block 14 and the embedded sync symbols, are coupled to a pulse shaping filter (18) which band limits the frequency spectrum of the composite signals from the synchronization symbol insertion block (16) and the serial to parallel symbol converter block (14).

The outputs of the pulse shaping filters (18A-18D) are coupled to modulators (20A-20D), each of which multiplies the outputs of the corresponding pulse shaping filters (18A-18D) by a sinewave quantity equal to $e^{(j2\pi f_i t)}$ where i runs from 1 to 4. The outputs of each of these modulator stages (20A-20D) is a complex zero IF signal carrying a fractional amount of the information in the serial bit stream (12) but centered by virtue of its modulation about a center frequency corresponding to the modulating input frequency to each of the modulator stages (20A-20D). The output of each of the modulator stages (20A-20D) corresponds to a QAM subchannel that carries discrete and periodic QAM symbols. The output of each of these modulator stages is summed together in a Summer (22) to form the complex zero IF output signal that is eventually transmitted from the antenna (28).

The complex zero IF output from the summer (22) is frequency shifted by an IF up-converter, or modulator (24) to some carrier frequency, $f_0$, amplified by an RF amplifier (26) for subsequent broadcasting on antenna (28). Each of the QAM subchannels broadcast from the antenna occupies its own frequency spectrum as a result of the modulation process used in the transmitter (10).

Figure 2:
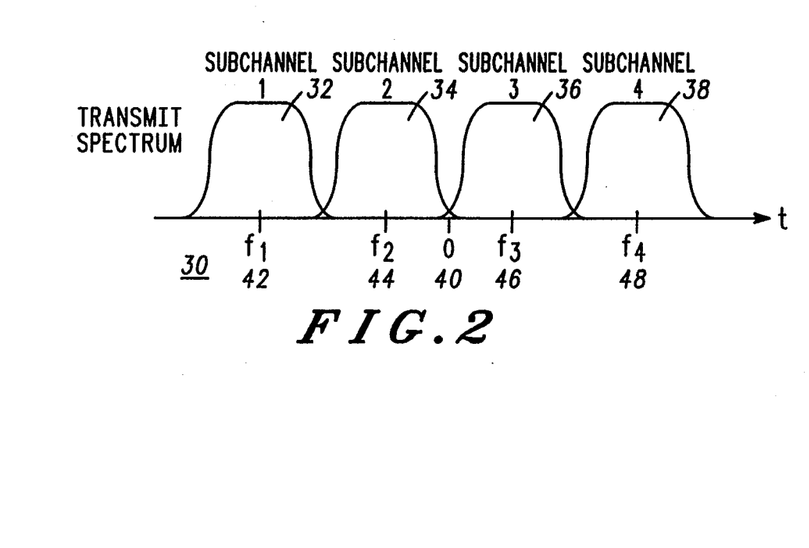
FIG. 2 shows a diagram of the transmit spectrum from the transmitter of FIG. 1.

FIG. 2 shows a representation of the transmit energy spectrum output from the transmitter (10) shown in FIG. 1. The frequency spectrum output from the transmitter (10) is as shown in FIG. 2 with four subchannels (32, 34, 36 and 38) centered about a center frequency $f_0$. Note that each subchannel (32, 34, 36 and 38) has its own center frequency $f_1+f_0$, $f_2+f_0$, $f_3+f_0$, and $f_4+f_0$ respectively (42, 44, 46 and 48 respectively).

The invention disclosed herein lies in both the use of synchronization symbols and the selection of the values of the synchronization symbols so as to optimize the performance of a QAM communication system.

Figure 3:
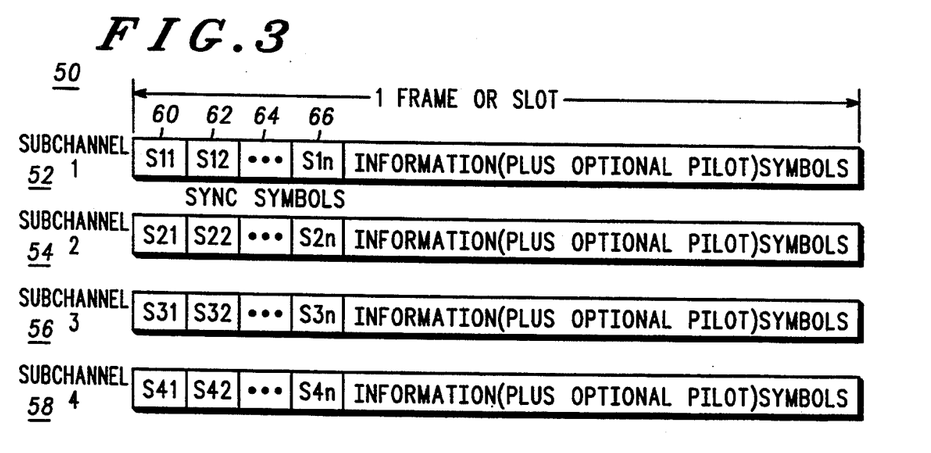
FIG. 3 shows a representation of synchronizing sequences and information present in each of the subchannels shown in FIG. 1.

FIG. 3 shows a representative diagram of the information that might be present on each of the subchannels 1 through 4 shown in FIG. 2. Note that subchannel 1 (52) is shown with a series of synchronizing sequences designated $S_{11}$, $S_{12}$, through $S_{1n}$. (These synchronizing sequences might be described as a sequence of symbols, represented as vectors that permit synchronization, or, signal vector synchronizing symbol sequences.) Subchannel 2 (54) has its own series of synchronizing symbols $S_{21}$, $S_{22}$, through $S_{2n}$. Similarly, subchannels 3 and 4, (56 and 58) have sync symbols $S_{31}$ through $S_{3n}$, and $S_{41}$ through $S_{4n}$ respectively. These synchronizing sequences are complex values added to the information to the subchannels 1 through 4 and are preselected values to simplify detection and decoding by a QAM receiver.

As shown in FIG. 3, the synchronizing sequences are added as a header to the information in a frame, or time slot, used to transmit the QAM. Alternate embodiments of the invention would include interleaving the synchronizing sequences in the data, placing the synchronizing sequences in the middle of the data stream or at the end of a data stream. FIG. 3 also shows that each QAM subchannel has a synchronizing sequence. Alternate embodiments of the invention would include appending such synchronizing sequences to less than all of the QAM subchannels. For example, only channels one and four, or, only channels two and three, shown in FIG. 3, might have sync sequences added to them.

Figure 4:
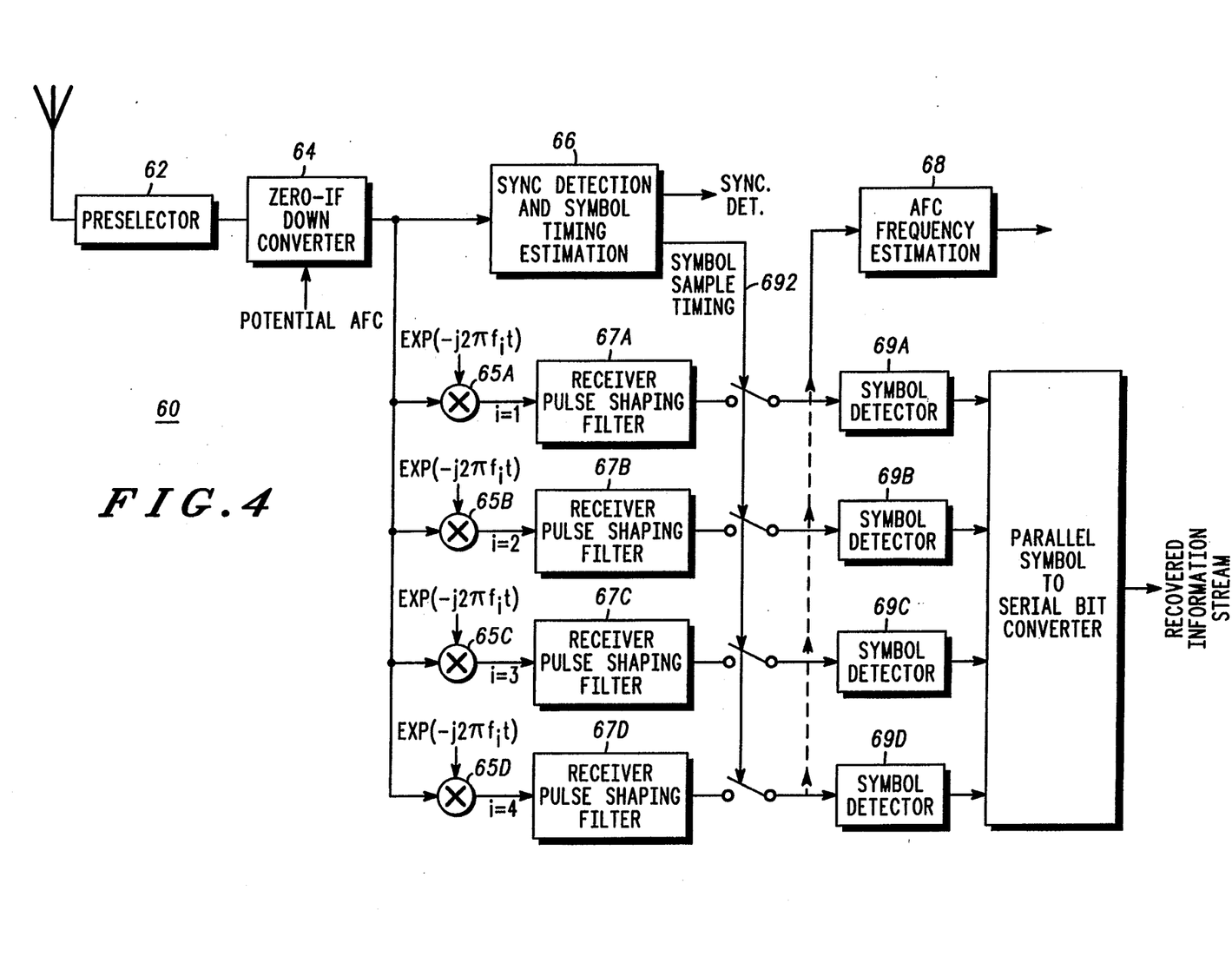
FIG. 4 shows a block diagram of a QAM receiver that might be capable of demodulating the information present in the information shown in FIG. 3 and FIG. 2.

FIG. 4 shows a simplified block diagram of a simplified block diagram of a QAM receiver. A frequency preselector (62) detects the RF energy in the transmit spectrum shown in FIG. 2 and presents this information to an IF stage (64) as shown the output of which is a zero IF signal, comprised of streams of complex quantities known or referred to as an in-phase and quadrature components of a zero-IF signal. This zero IF down converter (64) might include an automatic frequency control input that permits it to track shifts in frequency of the signal received by the receiver. A sync detection circuit (66) monitors these zero IF signals to find timing synchronization of the QAM symbols shown in the subchannels of FIG. 3. (Information in the QAM subchannels is transmitted as discrete packets, which are finite time periods of amplitude modulated and frequency shifted or phase modulated carrier signals. The sync detection circuit (66) includes circuitry to precisely identify, from the synchronizing sequences added to the information in the QAM subchannels, when information in the QAM subchannels should be sampled for detection.)

The zero-IF signal from the zero-IF converter 64 is coupled to four subchannel receivers that each include subchannel mixers (65a through 65d) and receiver pulse-shaping filters (67a through 67d). The subchannel mixers multiply the zero-IF signal by a signal, $e^{-j2\pi f_i t}$, where $f_i$ is the subchannel center frequency for the respective subchannels, one through four; t is time. The output of a subchannel mixer is a signal centered about zero hertz, which is filtered by a pulse shaping filter, (67a through 67d) to remove noise and any undesired subchannel signals.

The output of the pulse shaping filters is sampled at a rate determined by the sync detection circuit (66). The sampled outputs of the pulse shaping filters are input to symbol detector blocks, (69a through 69d) that estimate the information symbols originally transmitted.

Automatic frequency control is provided by an AFC block (68). The AFC block (68) receives the sampled output of the pulse shaping filters during the times when sync symbols are present, as determined by the sync detection block (66). Stated alternatively, the AFC block only utilizes sync symbol samples, $x_{ij}$, (where i is the subchannel number and j is the sync symbol number) from the pulse shaping filters when sync symbols are present. The sync symbol samples, $x_{ij}$, correspond to the originally transmitted sync symbol vectors, $S_{ij}$. The output of the AFC block is coupled to the zero-IF converter (64), or to possibly other frequency shifting stages between the preselector (62) and the symbol detectors (69a through 69d) to track received signal frequency shifts.

Figure 5:
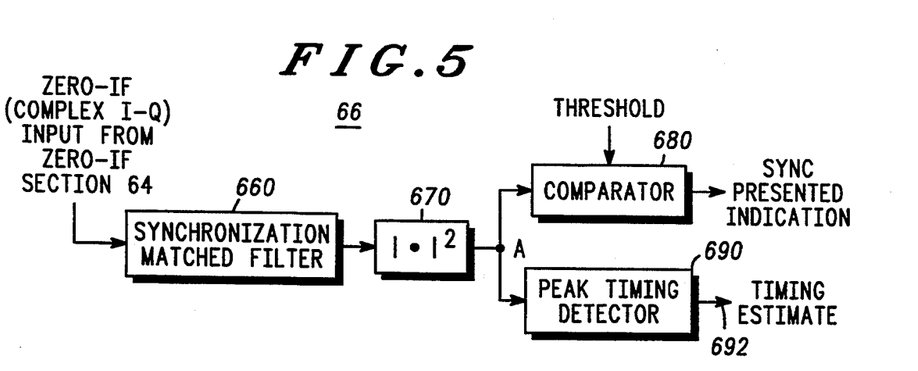
FIG. 5 shows a block diagram of a fractional part of the receiver shown in FIG. 4.

FIG. 5 shows a simplified block diagram of a sync matched filter and other circuitry associated with the sync detector (66) of FIG. 4. After being down-converted to zero-IF by the zero-IF down converter (64), a complex zero IF from the IF (64) of the receiver (60) is input to a synchronization matched filter (660) which is a filter whose impulse response closely approximates complex conjugate of the time reversed transmitted composite waveform. (Whatever signal appears at the antenna of the transmitter has a net composite waveform from the addition of the QAM subchannels, including synchronization sequences. The synchronization matched filter (660) tests only for the waveform from the transmitter due to the sequences of synchronization symbols $S_{ij}$ where i is the subchannel number and j is the synchronizing symbol time index, or number, sent. This filter (660) does not test for information in the QAM frame.)

The output of the synchronization matched filter (660) is coupled to a magnitude squaring block (670) which computes the square of the amplitude of the synchronization matched filter (660) output and allows the determination of the power level of the signal detected by the synchronization matched filter (660). The output of the magnitude squaring block (660) is compared against a threshold in a comparator (680) to determine whether or not the synchronization matched filter (660) has found a synchronization pattern from the transmitter (10). (As shown in FIG. 5A, the threshold can be chosen to discriminate against noise.)

Still referring to FIG. 5, the output of the magnitude squaring block is also coupled to a peak timing detector circuit (690). The peak timing detector circuit (690) finds the time of the occurrence of the peak output value from the magnitude squaring block. The time of occurrence of the peak output value from the magnitude squaring block provides timing information of the QAM symbol times to enable accurate symbol sampling by the receiver (60). (In FIG. 4, the output 692 of the sync detection block (66) controls when symbols are to be acquired.)

In the preferred embodiment, the receiver elements shown in FIG. 4, excluding the preselector (62) and zero IF (64) are performed by a digital signal processor, such as a Motorola DSP 56000.

It has been determined that if the subchannels shown in FIG. 3 are paired in such a way that subchannels are equally displaced about a particular frequency, $f_0$ (40) are loaded with synchronization vectors that are complex conjugates of each other, the waveforms produced by the addition of the modulated synchronization vectors requires a simplified receiver that must only identify a signal representing a resultant vector that has only real quantities. For example, referring to FIG. 2, if subchannel 1 and subchannel 4 are considered first and second halves of a pair of channels, both equally displaced from $f_0$ and therefore centered about the center frequency $f_0$ (40), and if subchannel 2 and subchannel 3 are considered as the first and second halves of a second pair of subchannels, both equally displaced from evenly displaced about $f_0$, loading a complex vector $S_{11}$ into the synchronizing symbol for subchannel 1, and loading its complex conjugate $S_{41}$ into subchannel 4, (where $S_{11}^*=S_{41}$ where the * denotes conjugate) produces (subsequent to pulse filtering and modulation) upon their addition a resultant signal that will have only a real component. Similarly, loading a complex vector $S_{21}$ into subchannel 2 and its complex conjugate $S_{31}$ into subchannel 3, (where $S_{31}=S_{21}^*$, where * denotes the conjugate) produces upon their addition a resultant signal that similarly has only real components to it.

Figure 8:
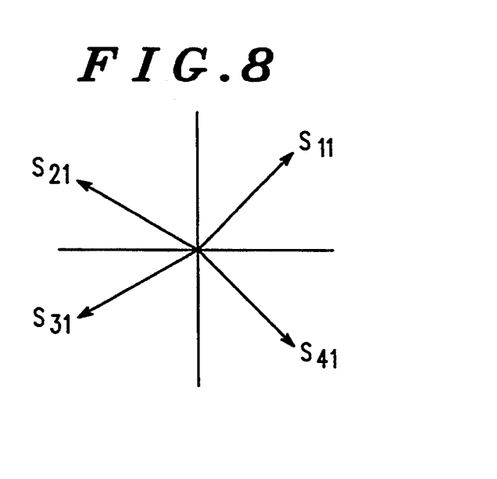
FIG. 8 shows a representative phasor diagram of vectors produced by the synchronizing sequence shown in FIG. 3.

Referring to FIG. 8, there is shown a map of vectors and complex conjugates of these vectors that are used to simplify synchronization and timing detection for the receiver. The first synchronizing vector $S_{11}$ is arbitrarily chosen at a 45 degree angle with a particular magnitude of M1. Its complex conjugate is used as the synchronizing symbol for subchannel 4 and is shown as $S_{41}$. The synchronizing symbols for subchannels 2 and 3 are also shown with the synchronizing vector for subchannel 2 represented by $S_{21}$ and synchronizing vector for subchannel 3 shown as $S_{31}$. Similar diagrams could be shown for other symbols ocurring at a particular time, comprising synchronization sequences, i.e. $S_{12}$, $S_{22}$, $S_{32}$, $S_{42}$, etc.

Figure 6A:
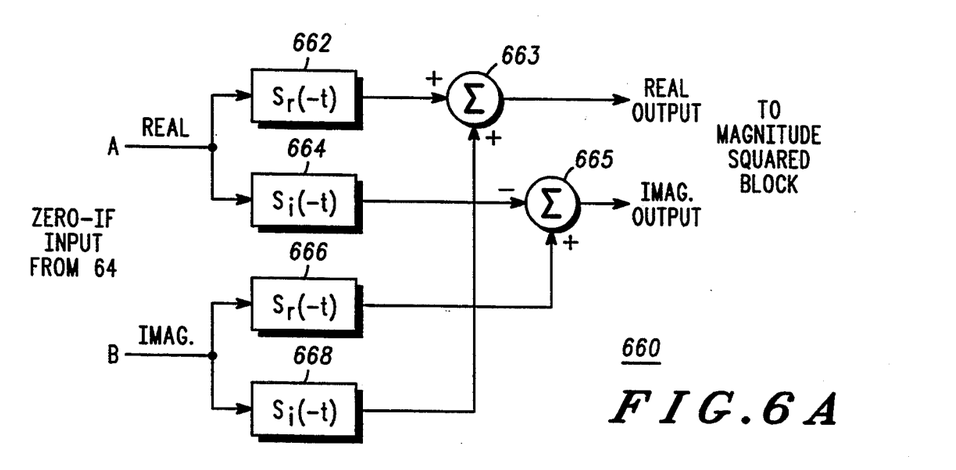
FIGS. 6A and 6B show embodiments of a sync matched filter.

Simplified detection of the transmitted symbol timing and synchronization by inclusion of complex vectors and conjugates is accomplished by the synchronization matched filter shown in FIG. 6. In FIG. 6a, the complex zero IF, denoted as the real portion (A) and the imaginary portion (B) is coupled to a complex filter comprised of elements 662, 664, 666, and 668. Each element has a real scalar input and real scalar output. The impulse response of this complex filter is matched to the quantity $s(t)=s_r(t)+js_i(t)$ where $s_r$ and $s_i$ are the real and imaginary components, respectively of s(t). S(t) represents the waveform of the composite of the synchronization symbol elements sent by the transmitter. The impulse response of the matched filter in general is approximately equal to $s^*(-t)=s_r(-t)-js_i(-t)$. Since the input to the matched filter is a complex signal, the actual implementation requires four real-valued filters as shown in FIG. 6a.

Figure 6B:
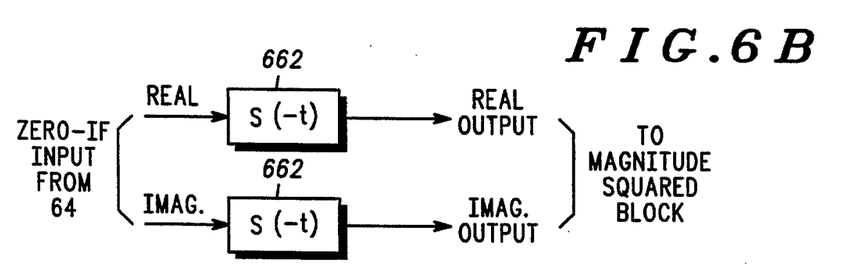

A simplification of the receiver shown in FIG. 6a, and one which is made possible by the use of complex synchronization vectors and their complex conjugates in paired, or matched, QAM subchannels, in accordance with the method of the invention, is shown in FIG. 6b.

In FIG. 6b, the complex zero IF signal is coupled to a filter comprised that is matched to the waveform produced by synchronization vectors that are complex conjugates of each other and which when modulated and added together prior to transmission produce a constant phase waveform. The filter shown in FIG. 6b is considerably simpler than that shown in FIG. 6a.

Figure 9:
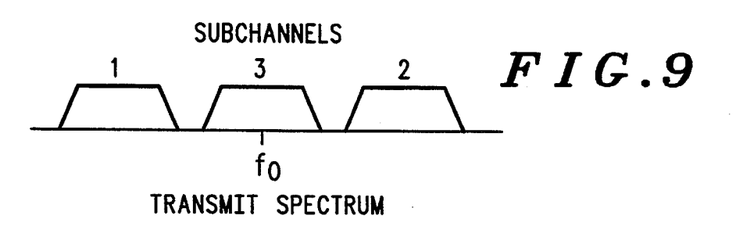
FIGS. 9 shows a transmit spectrum for a three-subchannel QAM signal.

Alternate embodiments of the QAM system would include splitting an information signal such as a binary information stream (12) into perhaps an odd number of subchannels. FIG. 9 shows 3 subchannels with first and second subchannels evenly displaced about a center frequency $f_0$. The third subchannel must of course be centered about $f_0$ for the sync matched filter of FIG. 6b to detect synchronization. An odd number of subchannels requires that the synchronizing sequences inserted into subchannels 1 and 2, be complex conjugates of each other. Since the resultant of these two synchronizing sequences when added together yields a real value, the synchronizing sequence added to subchannel 3 must be real valued.

Figure 10:
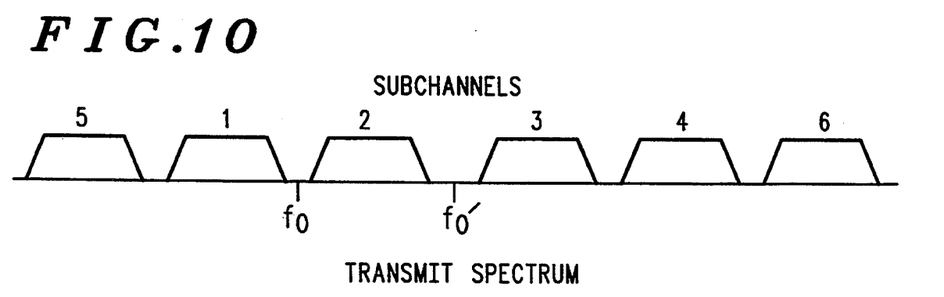
FIG. 10 shows a transmit spectrum for a six-subchannel QAM signal.

Another alternate embodiment of the transmitter shown in FIG. 1 (which would also require of course the accompanying circuitry and the receiver) might include a transmitter with several subchannels such as that shown in FIG. 10. Six subchannels might be centered around $f_0$ with the subchannels grouped as 2 and 3, 1 and 4, and 5 and 6. The addition of complex vectors and conjugates of these complex vectors would still produce a resultant synchronizing vector that would reside on the real axis.

It should be noted that in any multi-carrier QAM system described herein not all of the paired subchannels need to have the complex vector/complex conjugate vector synchronizing sequences added to them. Of any multi-carrier QAM system, at least one pair of the paired subchannels must have the synchronizing sequence described herein added to it to permit simplified synchronization detection. (The requirement that the subchannels be centered about a center frequency still holds.)

Using synchronizing sequences with a multi-carrier QAM system permits an improved automatic frequency control signal to be derived from the synchronizing sequences. Since the transmitter and receiver each attempt to demodulate signals at some frequency $f_0$, the $f_0$ frequency of the transmitter and receiver may be slightly offset with respect to each other, an AFC control signal by which the receiver (or possible the transmitter) operating frequency can be adjusted improves the QAM system performance. (The AFC control signal generated by the receiver might possible be returned to the transmitter where it could possibly be used to shift the transmitters $f_0$ to align with the receivers $f_0$.)

Figure 11:
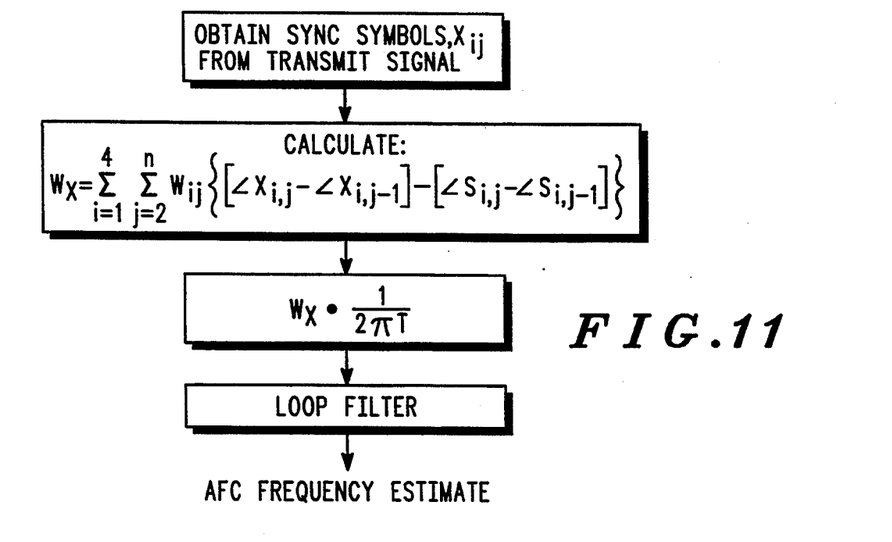
FIG. 11 shows a method of generating an AFC control signal.
Figure 11A:
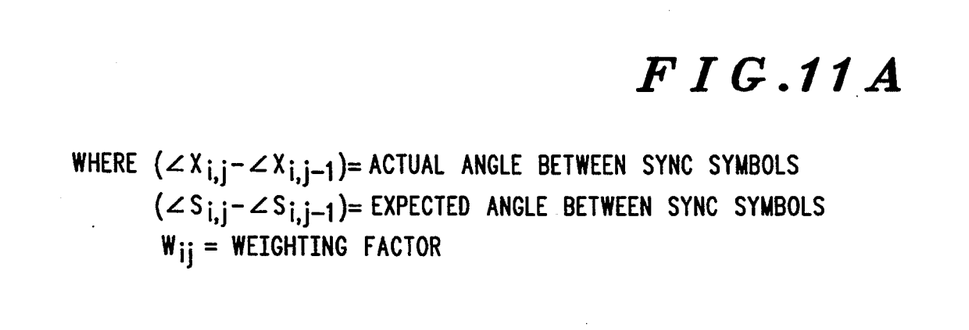

Referring to FIG. 11, having detected the synchronizing sequences, there is shown the steps required to derive an AFC control signal from successive received signal vector synchronizing symbol sequences, $x_{ij}$ (where x is a sync symbol and where i the QAM subchannel number, and where j is the sync symbol number) also referred to above as synchronizing sequences above, in a QAM signal. The successive synchronizing sequences used to calculate the AFC signal must be temporally adjacent, i.e., they must be adjacent, in time, to the other symbols used in the calculation.

For all successive samples of synchronizing symbols, calculate a series of numbers equal to the difference in actual phase angle, between pairs of temporally adjacent synchronizing vectors, $x_{ij}$. (Where i=1 to 4 for a four subchannel QAM system and where j=1 to n, where n is the number of sync symbols.)

For each of said N QAM subchannels, there is an expected phase angle difference between synchronizing symbols. The receiver will normally know this expected phase angle difference in advance. The method of generating an AFC control signal generation requires that for each of said N QAM subchannels, the expected phase angle difference between successive synchronizing vectors, $S_{ij}$, should be subtracted from the actual phase angle difference between temporally adjacent synchronizing vector samples, $x_{ij}$, forming thereby a series of numbers representing phase angle errors. (If the $f_0$ frequencies of the transmitter and receiver were identical, the actual phase angle differences would be equal to the expected phase angle differences. Since the $f_0$'s are likely to be different, there will be angular differences other than the expected values.)

The series of numbers obtained from this previous step is operated upon to form a weighted average phase angle. In the preferred embodiment, each of the differences forming this series was multiplied by a scalar value proportional to the product of the amplitudes of the temporally adjacent sync symbols $x_{ij}$.

After forming the weighted average, the resultant is divided by by a factor equal to $2\pi T$, producing a frequency error signal, where T is the time between successive synchronizing vectors in the subchannel, and where phase angles are in radians. The result of this operation is an estimate of the frequency offset between the receiver and transmitter. This estimated frequency offset may be further filtered to produce an AFC control signal.

Figure 12:
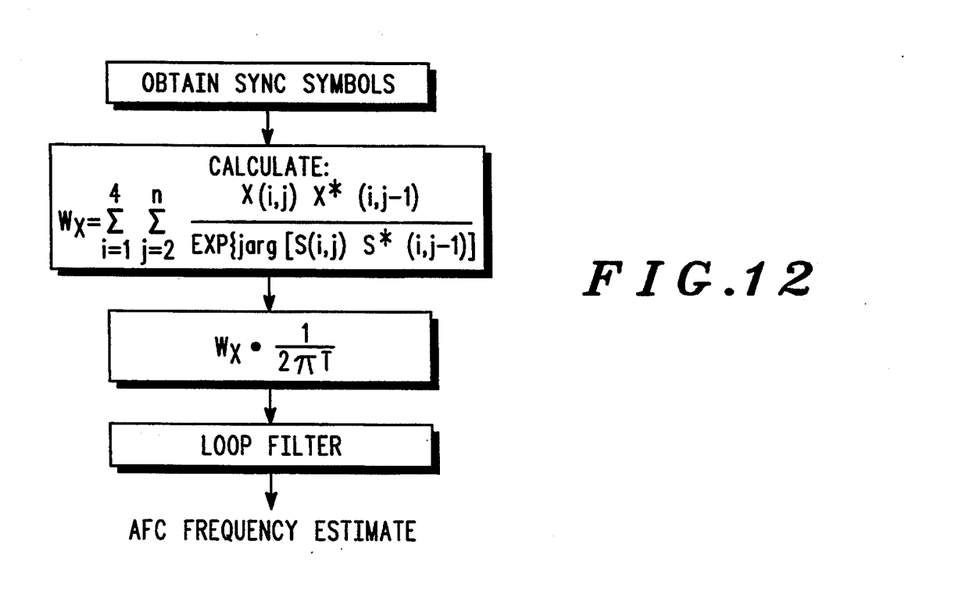
FIG. 12 shows an alternative method of generating an AFC control signal.

An alternative method of generating a weighted average phase angle is shown in FIG. 12 and reproduced in part below. Herein, each synchronizing symbol vector $x_{ij}$ is multiplied by a quantity equal to the complex conjugate of the previous synchronizing vector $x_{i,j-1}$. Each of these vector products is rotated by the negative of the expected phase angle difference between the corresponding sync symbols, $S_{ij}$ and $S_{i,j-1}$, forming another vector. A sum of all these vectors, for all sync symbols and for all subchannels is formed. The phase of this resultant vector (y) is the weighted average phase angle.

$$y = \sum_{i=1}^{4} \sum_{j=2}^{n} \left( \frac{x(i,j)x^*(i,j-1)}{e^{j\arg[S(i,j)S^*(i,j-1)]}} \right)$$

where i is the number of subchannel;

j is the synchronizing vector number;

n is the number of sync vectors per subchannel;

x(i,j) is the j'th synchronizing vector sample in QAM subchannel i;

x* is the complex conjugate of the vector x;

$e^{j\arg[S(i,j)S^*(i,j-1)]}$ is a unit amplitude vector, the phase of which is the expected angle between synchronizing vectors;

What is claimed is:

1. In a multicarrier information system wherein information in a first information signal is subdivided into N secondary information signals, each of said N secondary information signals including a substantially periodic stream of discrete samples of the information in said first information signal and occupying separate frequency ranges, each of said N secondary information signals carrying a fractional amount of the information in said first information signal and modulating a carrier signal using quadrature-amplitude modulation (QAM) forming thereby N QAM subchannels substantially centered about a center frequency, each channel carrying discrete and periodic QAM symbols, each QAM symbol representing a portion of said first information signal, an improved method of providing timing and frequency synchronization information to a QAM receiver, said method comprising the steps of:

providing QAM signal synchronizing symbol sequences to substantially each of said N secondary information signals, accompanying transmission of information from said first information signal such that the QAM receiver can detect QAM signal timing and frequency synchronization for said QAM subchannels from said QAM signal synchronizing symbol sequences;

when N is even, arranging an even number of said N QAM subchannels into a number of pairs of frequency bands, said pairs of frequency bands displaced evenly about said center frequency; and when N is odd, arranging an even number of said N QAM subchannels into a number of paired frequency bands, said paired frequency bands centered about a predetermined frequency, an unpaired QAM subchannel being substantially centered about said center frequency.

2. The method of claim 1 further comprised of the steps of:

for at least one of the paired QAM subchannels:
loading the QAM signal synchronizing symbol sequence in one QAM subchannel of a pair of QAM subchannels with a first complex signal sequence and;
loading the QAM signal synchronizing symbol sequence in the other QAM subchannel of a pair of QAM subchannels with a complex conjugate of said first complex signal sequence.

3. The method of claim 1 further comprised of the steps of:

loading said unpaired QAM subchannel with a real-valued sequence.

4. In a multicarrier information system wherein information in a first information signal is subdivided into N secondary information signals, each of said N secondary information signals including a substantially periodic stream of discrete samples of the information in said first information signal and occupying separate frequency ranges, each of said N secondary information signals carrying a fractional amount of the information in said first information signal and modulating a carrier signal using quadrature-amplitude modulation (QAM) forming thereby N QAM subchannels substantially centered about a center frequency, each channel carrying discrete and periodic QAM symbols, each QAM symbol representing a portion of said first information signal, an improved method of providing timing and frequency synchronization information to a QAM receiver, said method comprising the steps of:

a) down-converting a transmitted QAM signal having a sequence of predetermined synchronization symbols appended to said QAM signal, to produce a complex zero-IF signal centered substantially about zero hertz;

b) filtering said complex zero-IF signal by a first filter possessing a response substantially matched to a composite transmitted signal, said composite transmitted signal obtained by adding said predetermined synchronization symbols to substantially each of said N QAM subchannels;

c) computing the square of the amplitude of the signal output from said first filter to obtain a first intermediate signal;

d) comparing the magnitude of said first intermediate signal against a first threshold value; and e) identifying occurrences of said first intermediate signal that exceed said first threshold value as being substantially optimum sampling times for QAM symbols.

5. In a multicarrier information system wherein information in a first information signal is subdivided into N secondary information signals, each of said N secondary information signals including a substantially periodic stream of discrete samples of the information in said first information signal and occupying separate frequency ranges, each of said N secondary information signals carrying a fractional amount of the information in said first information signal and modulating a carrier signal using quadrature-amplitude modulation (QAM) forming thereby N QAM subchannels substantially centered about a center frequency $f_0$, each subchannel carrying discrete and periodic QAM symbols, each QAM symbol representing a portion of said first information signal and each subchannel having a predetermined synchronizing sequence of complex-valued symbols appended to it, each of said complex-valued symbols having an associated magnitude and phase angle, said complex-valued symbols having an expected phase angle difference between successive symbols, an improved method of providing an automatic frequency control signal to a quadrature-amplitude receiver proportional to a frequency offset between $f_0$ of a transmitter and $f_0$ of said receiver, said method comprising the steps of:

obtaining temporally adjacent QAM signal synchronizing sequence symbols in substantially each of said QAM subchannels;

forming a series of products representative of a combination of each QAM signal synchronizing sequence symbols and a quantity substantially equal to a complex conjugate of a previous QAM signal synchronizing sequence symbol;

rotating each of said products by an amount substantially equal to the negative of an expected phase angle difference between corresponding synchronizing sequence symbols forming a series of rotated products;

obtaining a phase angle representative of a sum of the series of rotated products;

obtaining the phase angle of the sum of the series of rotated products by a first quantity substantially equal to $2\pi T$, where T is time between successive synchronizing symbols in the subchannel and where phase angles are measured in radians to produce a frequency error signal; and filtering said frequency error signal producing thereby an AFC control signal.

6. The method of claim 5 wherein said series of products is formed by multiplying each QAM signal synchronizing sequence symbol by said quantity substantially equal to said complex conjugate of said previous QAM signal synchronizing sequence symbol.

7. In a multicarrier information system wherein information in a first information signal is subdivided into N secondary information signals, each of said N secondary information signals including a substantially periodic stream of discrete samples of the information in said first information signal and occupying separate frequency ranges, each of said N secondary information signals carrying a fractional amount of the information in said first information signal and modulating a carrier signal using quadrature-amplitude modulation (QAM) forming thereby N QAM subchannels substantially centered about a center frequency $f_0$, each subchannel carrying discrete and periodic QAM symbols, each QAM symbol representing a portion of said first information signal and each subchannel having a predetermined synchronizing sequence of complex-valued symbols appended to it, each of said complex-valued symbols having an associated magnitude and phase angle, said complex-valued symbols having an expected phase angle difference between successive symbols, an improved method of providing an automatic frequency control signal to a quadrature-amplitude receiver proportional to a frequency offset between $f_0$ of a transmitter and $f_0$ of said receiver, said method comprising the steps of:

- detecting QAM signal synchronizing sequence symbols in at least one of said N QAM subchannels;
- calculating actual phase angle differences between pairs of temporally adjacent synchronizing sequence symbols;
- for each of said N QAM subchannels, obtaining an expected phase angle difference between successive synchronizing symbols from the actual phase angle difference between temporally adjacent synchronizing symbols, forming thereby a series of numbers representing phase angle errors;
- forming a weighted average of the phase angle errors obtained from substantially all subchannels; and
- producing a frequency error signal using said weighted average of the phase angle errors to thereby create a signal proportional to the frequency offset between $f_0$ of said transmitter and $f_0$ of said receiver.

8. The method of claim 7 wherein the step of producing said frequency error signal comprises dividing the weighted average of the phase angle errors by a first quantity substantially equal to $2\pi T$ to produce said frequency error signal, where T is time between successive synchronizing symbols in the subchannel and where phase angles are in radians.

9. The method of claim 7 further comprising the step of filtering said frequency error signal, producing thereby an AFC control signal.

* * * * *